(12) United States Patent
Hahn et al.

(10) Patent No.: US 8,273,593 B2
(45) Date of Patent: Sep. 25, 2012

(54) METHOD FOR PRODUCTION OF A RADIATION-EMITTING SEMICONDUCTOR CHIP

(75) Inventors: Berthold Hahn, Hemau (DE); Stephan Kaiser, Regensburg (DE); Volker Härle, Laaber (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/027,810

(22) Filed: Feb. 15, 2011

(65) Prior Publication Data

US 2011/0140141 A1 Jun. 16, 2011

Related U.S. Application Data

(62) Division of application No. 11/579,194, filed on Jun. 18, 2007, now Pat. No. 7,897,423.

(51) Int. Cl.
*H01L 21/66* (2006.01)
*H01L 21/30* (2006.01)

(52) U.S. Cl. .......... 438/47; 438/458; 257/E21.122

(58) Field of Classification Search ............ 438/47, 438/458; 257/E21.122
See application file for complete search history.

(56) References Cited

U.S. PATENT DOCUMENTS

| | | | |
|---|---|---|---|
| 3,739,217 A | 6/1973 | Bergh et al. | |
| 6,071,795 A * | 6/2000 | Cheung et al. | 438/458 |
| 6,233,267 B1 | 5/2001 | Nurmikko et al. | |
| 6,294,475 B1 | 9/2001 | Schubert et al. | |
| 6,455,340 B1 | 9/2002 | Kneissl et al. | |
| 6,559,075 B1 | 5/2003 | Kelly et al. | |
| 6,849,881 B1 | 2/2005 | Härle et al. | |
| 2002/0031153 A1 | 3/2002 | Niwa et al. | |
| 2002/0195609 A1 | 12/2002 | Yoshitake et al. | |
| 2003/0114017 A1 * | 6/2003 | Wong et al. | 438/778 |
| 2003/0141506 A1 | 7/2003 | Sano et al. | |
| 2003/0168664 A1 | 9/2003 | Hahn et al. | |
| 2003/0173568 A1 | 9/2003 | Asakawa et al. | |
| 2003/0183824 A1 | 10/2003 | Doi et al. | |
| 2003/0209704 A1 | 11/2003 | Yamada | |

(Continued)

FOREIGN PATENT DOCUMENTS

DE 2 030 974 1/1971

(Continued)

OTHER PUBLICATIONS

Wong, W.S. et al., "$In_xGa_{1-x}N$ light emitting diodes on Si substrates fabricated by Pd-In metal bonding and laser lift-off", Applied Physics Letters, vol. 77, No. 18, pp. 2822-2824, Oct. 30, 2000.

(Continued)

*Primary Examiner* — Kevin Parendo
(74) *Attorney, Agent, or Firm* — Cozen O'Connor

(57) ABSTRACT

A method for micropatterning a radiation-emitting surface of a semiconductor layer sequence for a thin-film light-emitting diode chip, wherein the semiconductor layer sequence is grown on a substrate, a mirror layer is formed or applied on the semiconductor layer sequence, which reflects back into the semiconductor layer sequence at least part of a radiation that is generated in the semiconductor layer sequence during the operation thereof and is directed toward the mirror layer, the semiconductor layer sequence is separated from the substrate, and a separation surface of the semiconductor layer sequence, from which the substrate is separated, is etched by an etchant which predominantly etches at crystal defects and selectively etches different crystal facets at the separation surface.

15 Claims, 5 Drawing Sheets

U.S. PATENT DOCUMENTS

| | | | |
|---|---|---|---|
| 2003/0224582 A1 | 12/2003 | Shimoda et al. | |
| 2004/0051109 A1* | 3/2004 | Ishizaki et al. | 257/89 |
| 2004/0072382 A1 | 4/2004 | Kelly et al. | |
| 2004/0099873 A1 | 5/2004 | Illek | |
| 2004/0113156 A1 | 6/2004 | Tamura et al. | |
| 2004/0113167 A1 | 6/2004 | Bader et al. | |
| 2004/0189173 A1 | 9/2004 | Chowdhury et al. | |
| 2005/0239270 A1 | 10/2005 | Fehrer et al. | |
| 2006/0011925 A1 | 1/2006 | Bader et al. | |

FOREIGN PATENT DOCUMENTS

| | | |
|---|---|---|
| DE | 196 40 594 | 4/1998 |
| DE | 102 43 757 | 4/2001 |
| DE | 100 20 464 | 11/2001 |
| DE | 100 26 254 | 11/2001 |
| DE | 100 40 448 A1 | 3/2002 |
| DE | 100 64 448 | 7/2002 |
| DE | 102 45 628 | 4/2004 |
| JP | 10 190056 | 7/1998 |
| JP | 2002-338398 | 11/2002 |
| JP | 2003-188142 | 7/2003 |
| JP | 2004-179369 | 6/2004 |
| JP | 2003-69075 | 3/2007 |
| KR | 10-2003-0001326 | 1/2003 |
| WO | WO 98/14986 | 4/1998 |
| WO | WO 99/67815 | 12/1999 |
| WO | WO 01/39282 | 5/2001 |
| WO | WO 03/065464 | 8/2003 |

OTHER PUBLICATIONS

Schnitzer, I. et al., "30% external quantum efficiency from surface textured, thin-film light-emitting diodes", Applied Physics Letters, vol. 63, No. 18, pp. 2174-2176, Oct. 18, 1993.

Fujii, T. et al., "Increase in the extraction efficiency of GaN-based light-emitting diodes via surface roughening", Applied Physics Letters, vol. 84, No. 6, pp. 855-857, Feb. 9, 2004.

Fujii, T. et al., "Micro Cavity Effect in GaN-Based Light-Emitting Diodes Formed by Laser Lift-Off and Etch-Back Technique", Japanese Journal of Applied Physics, vol. 43, No. 3B, pp. L411-L413, 2004.

Schnitzer, I. et al., "Ultrahigh spontaneous emission quantum efficiency, 99.7% internally and 72% externally, from AlGaAs/GaAs/AlGaAs double heterostructures", Applied Physics Letters, vol. 62, No. 2, pp. 131-133, Jan. 11, 1993.

Zellweger, C.M. et al., "GaN-based single mirror light emitting diodes with high external quantum efficiency", Physica Status Solidi A, Wiley-VCH: 2003, vol. 200, No. 1, pp. 75-78.

English Translation of an Office Action issued on May 30, 2012 in the corresponding Korean Patent Application No. 10-2006-7025113.

* cited by examiner

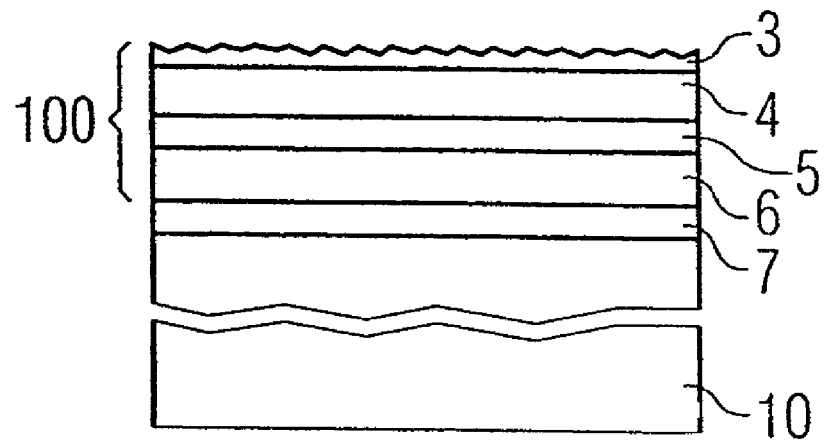
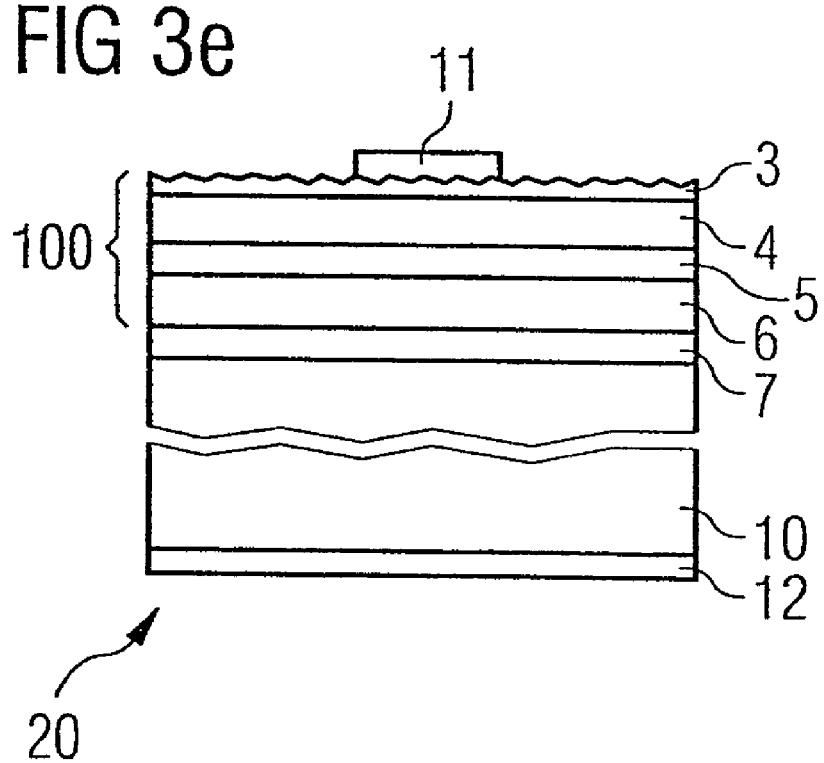

METHOD FOR PRODUCTION OF A RADIATION-EMITTING SEMICONDUCTOR CHIP

RELATED APPLICATIONS

This application is a divisional of U.S. patent application Ser. No. 11/579,194 which was filed with the U.S. Patent and Trademark Office on Jun. 18, 2007 which is a U.S. national stage of application No. PCT/DE2004/000892, filed on 29 Apr. 2004. The entire disclosures of each of these applications are expressly incorporated herein by reference.

FIELD OF THE INVENTION

The invention lies in the field of the micropatterning of radiation-emitting semiconductor chips. It relates to the roughening of a radiation-emitting surface of a radiation-generating semiconductor layer sequence, in particular a radiation coupling-out surface of a radiation-emitting semiconductor layer sequence of a thin-film light emitting diode chip.

BACKGROUND OF THE INVENTION

A thin-film light emitting diode chip is distinguished in particular by the following characteristic features:
  a reflective layer is applied or formed at a first main surface—facing toward a carrier element—of its radiation-generating epitaxial layer sequence, which reflective layer reflects at least part of the electromagnetic radiation generated in the epitaxial layer sequence back into the latter;
  the epitaxial layer sequence has a thickness in the region of 20 µm or less, in particular in the region of 10 µm; and
  at a second main surface—remote from the reflective layer—of the radiation-generating epitaxial layer sequence, the latter has an intermixing structure which ideally leads to an approximately ergodic distribution of the light in the epitaxial layer sequence, that is to say that it has an as far as possible ergodically stochastic scattering behavior.

A basic principle of a thin-film light emitting diode chip is described for example in I. Schnitzer et al., Appl. Phys. Lett. 63 (16), Oct. 18, 1993, 2174-2176, the disclosure content of which is in this respect hereby incorporated by reference.

The emitting zone of a thin-film light emitting diode chip is essentially restricted to the front-side patterned coupling-out surface of the extremely thin epitaxial layer sequence, as a result of which virtually the conditions of a Lambert surface radiator are established.

SUMMARY OF THE INVENTION

One object of the present invention is to provide an improved method for producing a micropatterning and also a thin-film light emitting diode chip having improved coupling out of light.

This and other objects are attained in accordance with one aspect of the invention directed to a method for micropatterning a radiation-emitting surface of a semiconductor layer sequence for a thin-film light-emitting diode chip comprising the steps of (a) growing the semiconductor layer sequence on a substrate, (b) forming or applying a mirror layer on the semiconductor layer sequence, which reflects back into the semiconductor layer sequence at least part of a radiation that is generated in the semiconductor layer sequence during operation thereof and is directed toward the mirror layer, (c) separating the semiconductor layer sequence from the substrate with a lift-off method, in which a separation zone in the semiconductor layer sequence is at least partly decomposed in such a way that anisotropic residues of a constituent of the separation zone—remain at a separation surface of the semiconductor layer sequence, from which the substrate is separated, and (d) etching the separation surface—provided with the residues—of the semiconductor layer sequence with a dry etching method, a gaseous etchant or a wet-chemical etchant, wherein the residues are at least temporarily used as an etching mask.

Another aspect of the present invention is directed to a method for micropatterning a radiation-emitting surface of a semiconductor layer sequence for a thin-film light-emitting diode chip comprising the steps of (a) growing the semiconductor layer sequence on a substrate, (b) forming or applying a mirror layer on the semiconductor layer sequence, which reflects back into the semiconductor layer sequence at least part of a radiation that is generated in the semiconductor layer sequence during the operation thereof and is directed toward the mirror layer, (c) separating the semiconductor layer sequence from the substrate, wherein a separation zone made of compound semiconductor material of the semiconductor layer sequence is at least partly decomposed, and (d) etching a separation surface of the semiconductor layer sequence, from which the substrate is separated, by means of an etchant which predominantly etches at crystal defects and selectively etches different crystal facets at the separation surface.

Another aspect of the invention is directed to an electromagnetic-radiation-emitting semiconductor chip comprising: an epitaxially produced semiconductor layer sequence having an n-conducting semiconductor layer, a p-conducting semiconductor layer and an electromagnetic-radiation-generating region arranged between these two semiconductor layers, at least one of the semiconductor layers having a nitride compound semiconductor material, and a carrier body, on which the semiconductor layer stack is arranged, wherein at least one semiconductor layer of the semiconductor layer sequence is micropatterned by means of a method as described above.

A method according to the technical teaching on which the present invention is based is particularly preferably suitable for thin-film light emitting diode chips having an epitaxial layer sequence based on nitride compound semiconductor material, in particular based on semiconductor material from the nitride compound semiconductor material system $In_xAl_yGa_{1-x-y}N$ where $0 \leq x \leq 1$, $0 \leq y \leq 1$ and $x+y \leq 1$.

In the present case, the group of semiconductor layer sequences based on nitride compound semiconductor material includes, in particular, those semiconductor layer sequences in which the epitaxially produced semiconductor layer which generally has a layer sequence made of different individual layers contains at least one individual layer which comprises a material from the nitride compound semiconductor material system $In_xAl_yGa_{1-x-y}N$ where $0 \leq x \leq 1$, $0 \leq y \leq 1$ and $x+y \leq 1$.

Such a semiconductor layer sequence may have for example a conventional pn junction, a double heterostructure, a single quantum well structure (SQW structure) or a multiple quantum well structure (MQW structure). Such structures are known to the person skilled in the art and are therefore not explained in any further detail at this juncture. One example of a multiple quantum well structure based on GaN is described in U.S. Pat. No. 6,849,881, the disclosure content of which is hereby incorporated by reference A method for micropatterning a radiation-emitting surface of a semiconductor layer sequence for a thin-film light emitting diode chip according to an embodiment of the invention is based on the basic concept that after the epitaxial growth of the semiconductor layer sequence on a growth substrate optimized to the greatest possible extent with regard to the growth conditions and after the formation or application of the mirror layer onto the semiconductor layer sequence the semiconductor layer sequence is separated from the growth substrate. This separation is effected in a separation zone of the semiconductor layer sequence, which is at least partly decomposed in such a way that anisotropic residues of a constituent of the separation zone, in particular a metallic constituent of the separation layer, remain at the separation surface of the semiconductor layer sequence, from which the substrate is separated.

The separation surface of the semiconductor layer sequence, on which the residues are situated, is subsequently etched in material-removing fashion during a preliminary etching step using the residues as an etching mask by means of a dry etching method, by means of a gaseous etchant or by means of a wet-chemical etchant. In this case, the residues are preferably simultaneously eliminated at least for the most part, that is to say that the anisotropic residues act only temporarily as an etching mask.

The residues remain after the separation step on the separation surface usually as a continuous layer having a varying thickness or already have insular or reticulated zones with interspaces in which the surface of the semiconductor layer sequence has already been uncovered.

During the preliminary etching step, the semiconductor layer sequence is then etched to different extents depending on the layer thickness of the residues, with the result that a roughening of the separation surface of the semiconductor layer sequence arises.

In one preferred embodiment, different crystal facets of the semiconductor layer sequence are uncovered. After the preliminary etching of the separation surface, the latter is particularly advantageously treated by means of a subsequent etching step with a wet-chemical or gaseous etchant which predominantly etches at crystal defects and selectively etches different crystal facets at the separation surface of the semiconductor layer sequence. For this purpose, the wet-chemical etchant particularly preferably contains KOH. A corrosive gas such as H or Cl, for example, is suitable as the gaseous etchant. H is preferably used as an etching gas at an elevated temperature, in particular greater than or equal to 800° C.

For the case where during the separation of the semiconductor layer sequence from the growth substrate, only insignificant residues remain on the separation surface and/or these can be eliminated at least for the most part by means of an etchant which predominantly etches at crystal defects of the semiconductor layer sequence and selectively etches different crystal facets at the separation surface; the preliminary etching step set forth above may be obviated.

In the case of a separation zone with nitride compound semiconductor material, this zone is preferably decomposed in such a way that gaseous nitrogen arises. For this purpose, a laser lift-off method (also called laser lift-off for short) is particularly preferably suitable as separation method. Such a laser lift-off method is explained in published U.S. patent application US 2004/0072382 for example, the disclosure content of which is hereby incorporated by reference. A different separation method in which anisotropic residues of a constituent of the separation layer, in particular a metallic constituent of the separation layer, remain at the separation surface could be used as an alternative.

The semiconductor layer sequence advantageously has at the separation surface an increased defect density in comparison with a part of the semiconductor layer sequence that is disposed downstream of the separation surface from the point of view of the substrate. The separation zone preferably lies in a buffer layer between growth substrate and radiation-generating region of the semiconductor layer sequence.

A buffer layer is a semiconductor layer of the semiconductor layer sequence which faces toward the substrate and which essentially serves for producing an optimum growth surface for the subsequent growth of the functional layers of the semiconductor layer sequence (for example a multiple quantum well structure). Such a buffer layer compensates for example for differences between the lattice constant of the substrate and the lattice constant of the semiconductor layer sequence and also crystal defects of the substrate. The buffer layer can likewise be used to set strain states for the growth of the semiconductor layer sequence in a targeted manner.

Particularly preferably, the separation zone substantially has GaN and preferably anisotropic residues made of metallic Ga remain on the separation surface of the semiconductor layer sequence.

That region of the semiconductor layer sequence in which the separation zone is situated is preferably provided with a dopant concentration of between $1*10^{18}$ cm$^{-3}$ and $1*10^{19}$ cm$^{-3}$ inclusive. In this case, the semiconductor layer sequence advantageously has a dopant concentration of between $1*10^{18}$ cm$^{-3}$ and $1*10^{20}$ cm$^{-3}$ inclusive at its separation surface. This simplifies the formation of an ohmic contact on the semiconductor layer sequence. If the region is substantially based on GaN, then Si is preferably used as the dopant.

In another preferred embodiment, the separation zone contains AlGaN, the Al content of which is chosen in such a way that it is decomposed during the separation of the semiconductor layer sequence from the growth substrate, and Al is sintered into the semiconductor layer sequence. For this purpose, the Al content preferably lies between approximately 1% and approximately 10%, in particular between approximately 1% and approximately 7%. In order to produce an Al-n-type contact, during the separation operation Al is preferably melted and sintered into the semiconductor layer sequence. For this purpose, a laser lift-off method is particularly preferably used in which the laser has a wavelength in a range of less than 360 nm, preferably a wavelength of between 350 nm and 355 nm inclusive.

In one advantageous development of the method, the separation zone has a GaN layer adjoined by an AlGaN layer as seen from the substrate. During the separation of the semiconductor layer sequence from the growth substrate, the entire GaN layer and part of the AlGaN layer are decomposed. This entails the advantage that if it is necessary for reasons of layer quality or for other reasons, firstly it is possible to grow a GaN layer which is thinner than the separation zone which is decomposed during the separation operation. During the separation operation, the GaN layer and part of the overlying AlGaN layer are then decomposed, which, if desired, is associated with the advantages outlined in the previous paragraph. The AlGaN layer in this case once again preferably has an Al content that lies between approximately 1% and approximately 10%, in particular between approximately 1% and approximately 7%.

A sapphire substrate is preferably used as the growth Substrate. This advantageously has good transmissivity in a large wavelength range for electromagnetic radiation. In particular, sapphire is transmissive for wavelengths of less than 350 nm, which is of great importance with regard to the decomposition of GaN or GaN-based material.

In a further method step, a contact pad, in particular a contact metallization for electrical connection of the semiconductor layer sequence, is applied to the micropatterned separation surface of the semiconductor layer sequence. The conventionally known metallization layers, such as, for example TiAl, Al or TiAlNiAu contacts, are suitable for this purpose.

Particularly preferably, through the micropatterning at the separation surface of the semiconductor layer sequence a roughening is produced on a scale (that is to say with a feature size) which corresponds to a wavelength range (relative to the internal wavelength in the chip) of an electromagnetic radiation generated by the semiconductor layer sequence during operation thereof.

The method is particularly preferably applied in the case of a semiconductor layer sequence based on semiconductor material from the hexagonal nitride compound semiconductor material system $In_xAl_yGa_{1-x-y}N$ where $0 \leq x \leq 1$, $0 \leq y \leq 1$ and $x+y \leq 1$, in which the 000-1 crystal face (n face of the hexagonal nitride lattice) faces toward the growth substrate.

The epitaxial growth of the semiconductor layer sequence is preferably effected by means of MOVPE (metal organic vapor phase epitaxy).

A Bragg mirror may be applied as the mirror layer. As an alternative, it is possible to produce a mirror layer having a radiation-transmissive layer and a reflective layer disposed downstream thereof as seen from the semiconductor layer sequence.

It is likewise possible for the mirror layer to have a reflection layer with a plurality of windows toward the semiconductor layer sequence and for a current transport layer that is different from the reflection layer to be arranged in the windows.

An electromagnetic-radiation-emitting semiconductor chip produced by a method according to the invention has at least one epitaxially produced semiconductor layer sequence having an n-conducting semiconductor layer, a p-conducting semiconductor layer and an electromagnetic-radiation-generating region arranged between these two semiconductor layers. At least one of the semiconductor layers contains a nitride compound semiconductor material and the semiconductor layer sequence is mounted onto a carrier body by that side which is remote from a micropatterned surface of the semiconductor layer sequence, that is to say by the side on which the mirror is arranged. In a further embodiment of the semiconductor chip, the mirror layer is also micropatterned.

In one embodiment of the method, after the lift-off step by means of laser lift-off, for example, only a reticulated or insular structure of metallic material remains rather than a completely continuous layer of metallic material from the separation zone on the semiconductor layer sequence, which structure, during the subsequent preliminary etching step, is transferred at least approximately into the semiconductor layer sequence in order to deliberately offer different crystal facets for the subsequent etching step. During the subsequent etching step, the etchant acts selectively on different crystal facets and thus leads to a microscopic roughening of the separation surface of the semiconductor layer sequence. Etching edges from the preliminary etching step and crystal defects in the semiconductor layer sequence at the separation surface thereof serve as etching seeds in this case.

The formation or the application of the mirror layer on the semiconductor layer sequence, which reflects back into the semiconductor layer sequence at least part of a radiation generated in the semiconductor layer sequence during the operation thereof, may be effected before or after the micropatterning of the semiconductor layer sequence, the former alternative being particularly preferred. The mirror layer represents an essential constituent of a thin-film light emitting diode. The mirror layer may also be connected to the micropatterned semiconductor layer sequence together with a carrier body for the semiconductor layer sequence.

In principle, the invention is not restricted to use in the case of a thin-film light emitting diode chip, but rather can be used in principle wherever micropatterned surfaces are required on epitaxially produced semiconductor layer sequences stripped from the growth substrate.

BRIEF DESCRIPTION OF THE DRAWINGS

Further advantages, preferred embodiments and developments of the method and of the light emitting diode chip emerge from the exemplary embodiments explained below in conjunction with FIGS. 1a to 3b, in which:

FIGS. 3a to 3e show a schematic illustration of a method sequence in accordance with a second exemplary embodiment.

DETAILED DESCRIPTION OF THE DRAWINGS

Figure 1A:
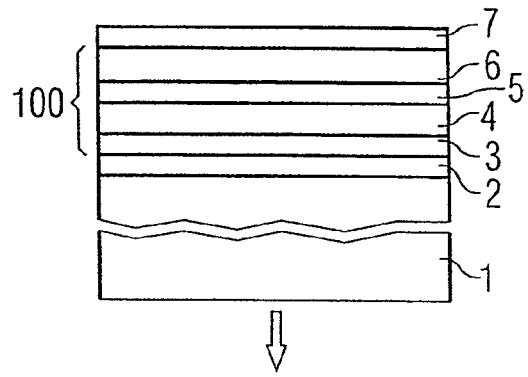
FIGS. 1a to 1e show a schematic illustration of a method sequence in accordance with a first exemplary embodiment.
Figure 1B:
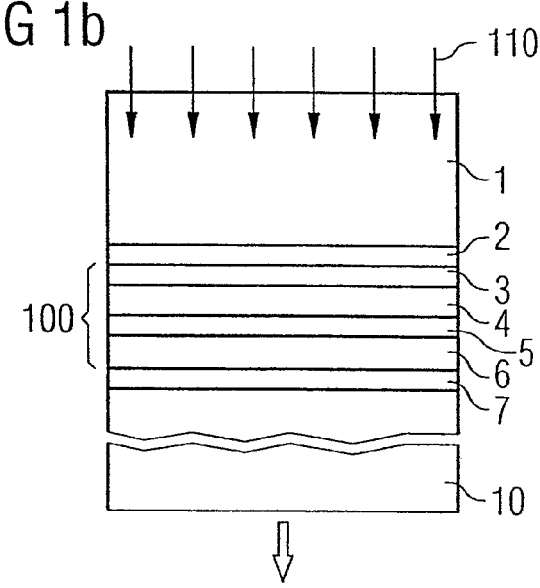
Figure 1C:
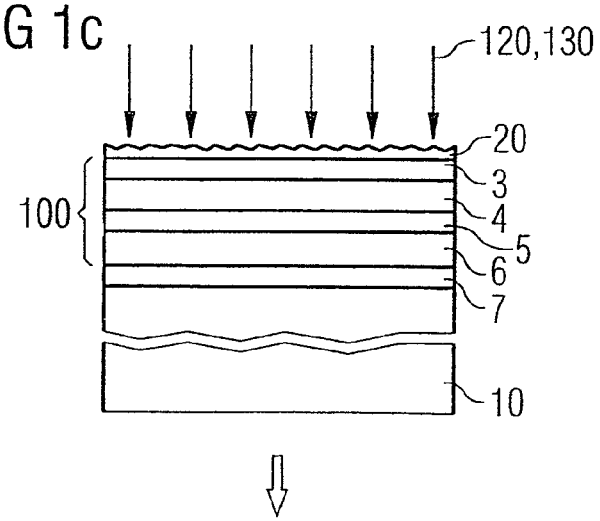

In the exemplary embodiments and figures, identical or identically acting constituents are in each case provided with the same reference symbols. The layer thicknesses illustrated are not to be regarded as true to scale, rather they are illustrated with exaggerated thicknesses in order to afford a better understanding. The epitaxial layers, too, are not illustrated with the correct thickness relationships with one another.

In the method sequence illustrated schematically in FIGS. 1a to 1e, firstly a semiconductor layer sequence is grown onto a growth substrate 1 made of sapphire by means of metal organic vapor phase epitaxy (MOVPE). Said semiconductor layer sequence has, proceeding from the sapphire substrate 1, the following successive layers (cf. FIG. 1a):

Si-doped GaN buffer layer 2
Si-doped GaN contact layer 3 (may also belong in part to the buffer layer)
Si-doped GaN cap layer 4
Layer 5 that generates electromagnetic radiation (in particular green or blue light) and has a multiple quantum well structure with a plurality of InGaN quantum wells and GaN barriers situated between the latter
p-doped AlGaN cap layer 6 (e.g. Mg as p-type dopant).

Although not shown, the p-doped AlGaN cap layer 6 is preferably also followed by a p-doped GaN layer (for example likewise doped with Mg).

The contact layer 3 may alternatively have Si:AlGaN.

A multiple quantum well structure mentioned above is described in U.S. Pat. No. 6,849,881, for example, the disclosure content of which is hereby incorporated by reference.

A single quantum well structure, a double heterostructure or a single heterostructure may also be used instead of the multiple quantum well structure.

A metallic mirror layer 7 is applied on the semiconductor layer sequence 100, said mirror layer being designed in such a way that it can reflect an electromagnetic radiation generated in the active layer back into the semiconductor layer sequence 100. Al or Ag is suitable as mirror material in the blue spectral range. With the use of Ag, the mirror layer may be underlaid with a thin Ti, Pd or Pt layer. This leads in particular to an improved adhesion of the Ag layer on the semiconductor layer sequence 100. The layer thickness of such an adhesion improving layer is preferably less than 1 nm.

As an alternative, a Bragg mirror may be applied as the mirror layer 7 or it is possible to produce a mirror layer which has a radiation-transmissive layer, e.g. made of ITO, and a reflective layer disposed downstream thereof as seen from the semiconductor layer sequence. It is likewise possible for the mirror layer to have a reflection layer with a plurality of windows toward the semiconductor layer sequence 100 and for a current transport layer that is different from the reflection layer to be arranged in the windows.

The semiconductor layer sequence is subsequently connected by the mirror side to an electrically conductive carrier body 10, which is made for example of GaAs, Ge or Mo. This is effected for example by means of eutectic bonding by means of AuGe, AuSn or PdIn. However, soldering or adhesive bonding is possible, too. The sapphire substrate 1 is subsequently separated by means of a laser lift-off method indicated by the arrows 110 in FIG. 1b, the buffer layer 2 being decomposed in such a way that gaseous nitrogen arises and residues 20 made of metallic gallium remain in the form of an anisotropic layer having a varying layer thickness on the semiconductor layer sequence 100. In this respect, cf. FIG. 1c. A corresponding laser lift-off method is described in US published patent application US 2004/0072382, for example, the disclosure content of which is hereby incorporated by reference.

The residues 20 are subsequently removed during a preliminary etching step using an etchant 120 which etches in material-removing fashion both metallic Ga and the Si-doped GaN contact layer 3. The surface of the Si-doped GaN contact layer 3 is thereby roughened. In this case, the anisotropically distributed residues made of metallic gallium act as a temporary etching mask in this respect.

Wet-chemical etching is preferably effected during the preliminary etching step. In particular, KOH in dilute form is suitable as the etchant. In a particularly preferred configuration of the invention, KOH with a concentration of 5% at room temperature is used during this etching step, the etching duration being between 5 min and 15 min.

As an alternative, for example a dry etching method (RIE method) is also suitable for the preliminary etching step. A dry etching method generally acts in a directional manner, so that in this configuration of the invention the form of the residues is transferred into the underlying semiconductor layer and a roughening of said semiconductor layer is thus obtained.

In a further alternative of the invention, a corrosive gas, for example H or Cl, is used as the etchant, preferably at an elevated temperature that is, in particular, greater than or equal to 800° C.

The laser lift-off methods comprise a decomposition of semiconductor material. The space being filled with the material that is to be decomposed is defined as the "separation zone". According to one embodiment, the separation zone is equal to the buffer layer, i.e. the thickness and the position of the separation zone and of the buffer layer are substantially identical. According to another embodiment, the separation zone comprises a thickness which is thinner than the buffer layer's thickness. As one example of this embodiment, the separation zone is a part of the buffer layer. As another example, the separation zone overlaps partly with the buffer layer. As yet another example, the separation zone is spaced by a short distance from the buffer layer.

Different crystal facets of the contact layer 3 are uncovered during the preliminary etching step. The preliminarily etched surface of the contact layer 3 is then treated with a further wet-chemical etchant in a subsequent etching step (indicated by the arrows having the reference symbol 130), which etchant predominantly etches at crystal defects and selectively etches different crystal facets at the separation surface of the semiconductor layer sequence (cf. FIG. 1d). The further wet-chemical etchant contains KOH in the case of the example. The surface of the contact layer can be roughened very effectively by the treatment with KOH; the roughness produced during the preliminary etching is considerably improved with regard to efficiency for coupling Out radiation.

KOH in concentrated form is preferably used as the etchant during the subsequent etching step. In a further preferred configuration of the invention, etching is in this case effected using KOH having a concentration of 25% at a temperature of between 70° C. and 90° C., for example at 80° C., the etching time being between 3 min and 10 min.

As an alternative, a corrosive gas, for example H or Cl, may be used as the etchant for the subsequent etching step.

Figures 2A, 2B:
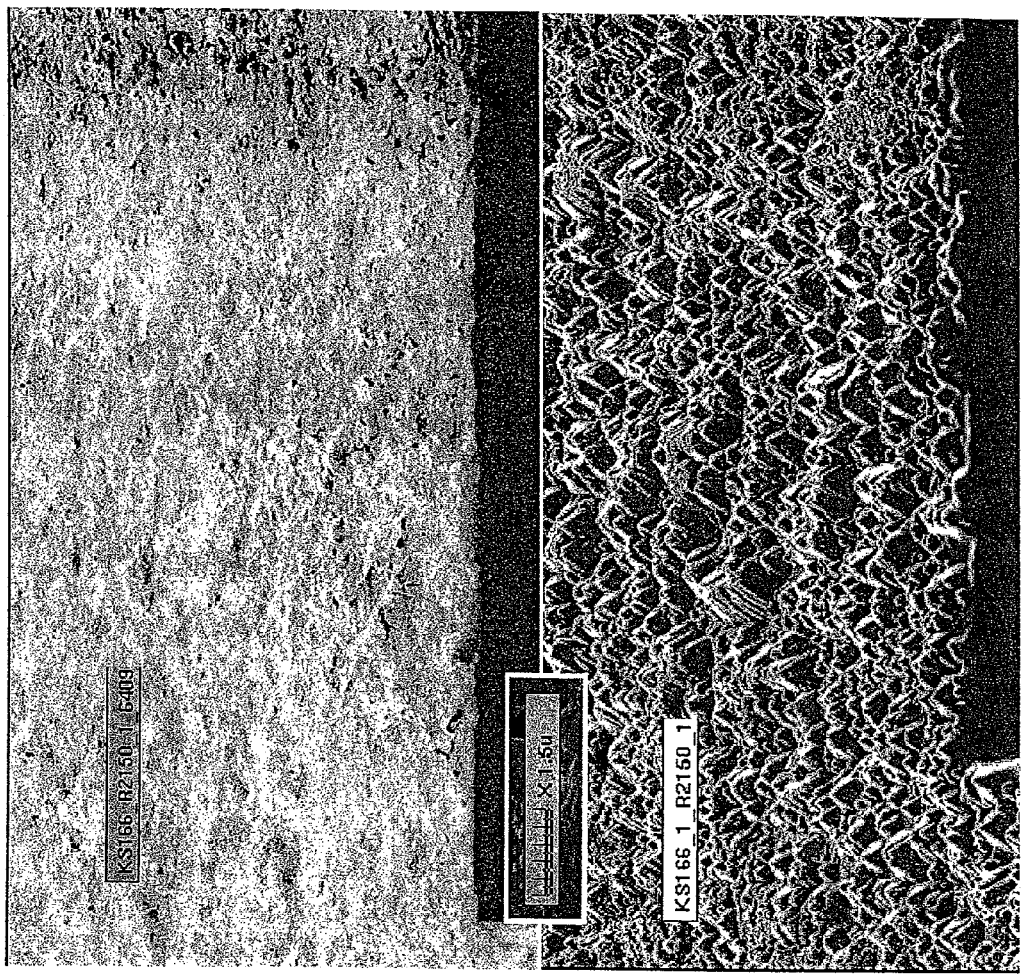
FIGS. 2a and 2b show SEM micrographs of a semiconductor surface at different method stages of the exemplary embodiment.
Figure 3A:
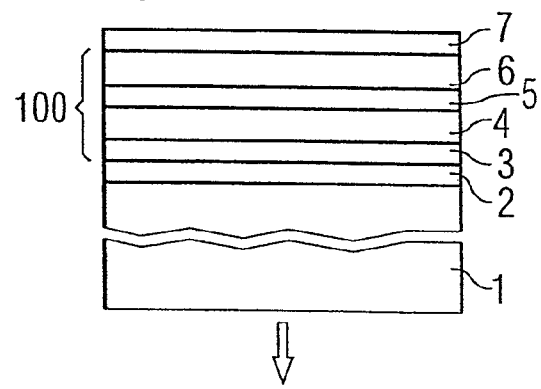
Figure 3B:
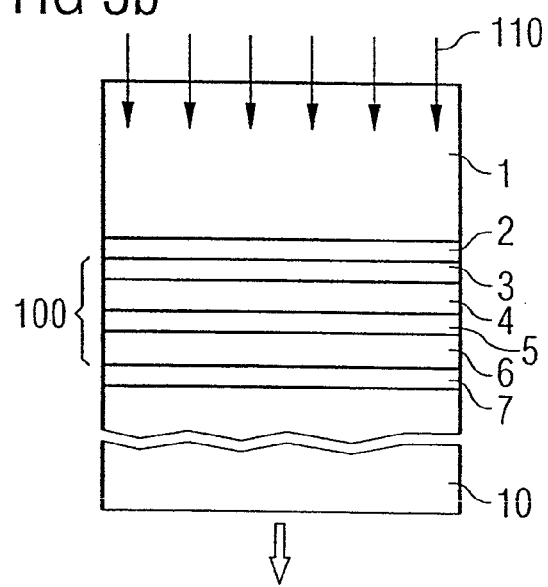
Figure 3C:
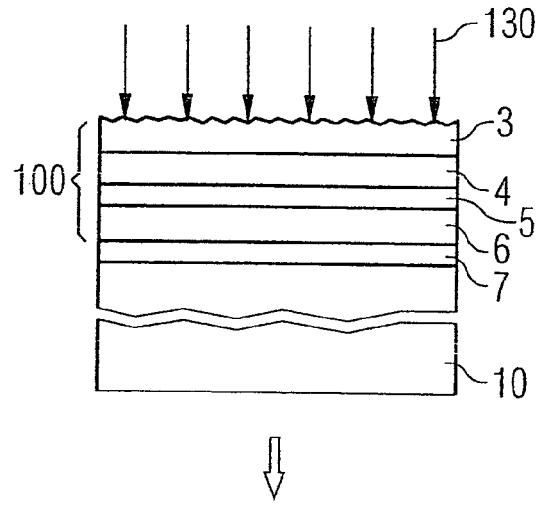

FIG. 2a shows a surface after the dry etching used for the preliminary etching step. FIG. 2b shows a surface after the further etching using KOH.

To improve the roughening effect, the contact layer 3 has, at least at the side facing toward the buffer layer 2, an increased defect density in comparison with the subsequent layers 4, 5 and 6. It is usually desirable to realize as low a defect density as possible. However, in accordance with an embodiment of the invention, it is taught to deliberately significantly increase the defect density of one of the semiconductor layers as compared to the usually sought after low defect density in order to improve the roughening effect. The higher the defect density, the more disorder there is in the semiconductor layer, which is helpful for realizing a rough ("disordered") surface as compared to a smooth ("ordered") surface.

Furthermore, the contact layer 3 has an Si dopant concentration of between $1*10^{18}$ cm$^{-3}$ and $1*10^{19}$ cm$^{-3}$ inclusive at least at the side facing toward the buffer layer. This enables simple production of an ohmic contact on the contact layer 3.

Figure 1D:
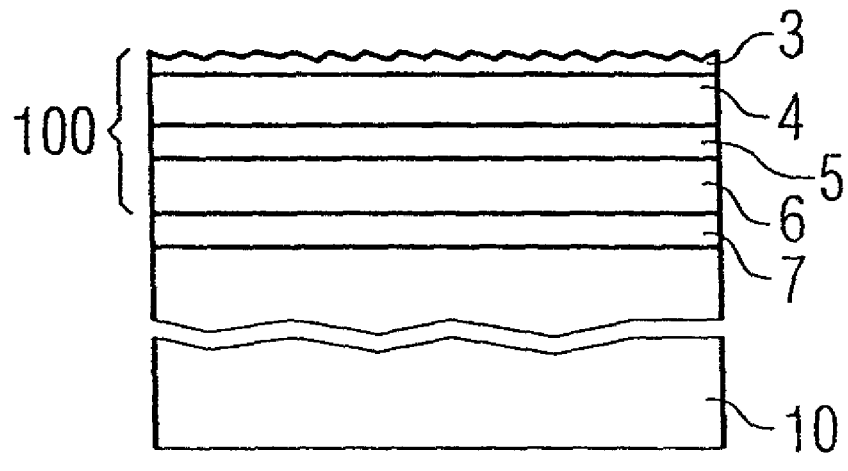

In an alternative configuration of the exemplary embodiment, the GaN buffer layer 2 is thinner than the layer thickness decomposed during the laser lift-off method, and the Al content of the contact layer 3 is between approximately 1% and approximately 7% at least in a region facing toward the buffer layer 2. Said region of the contact layer 3 is decomposed with the formation of gaseous nitrogen and metallic Ga and Al during laser lift-off and Al is melted and sintered into the remaining contact layer 3. This is shown in FIG. 1d.

An aluminum n-type contact can be produced at the GaN contact layer 3 in this way.

Figure 1E:
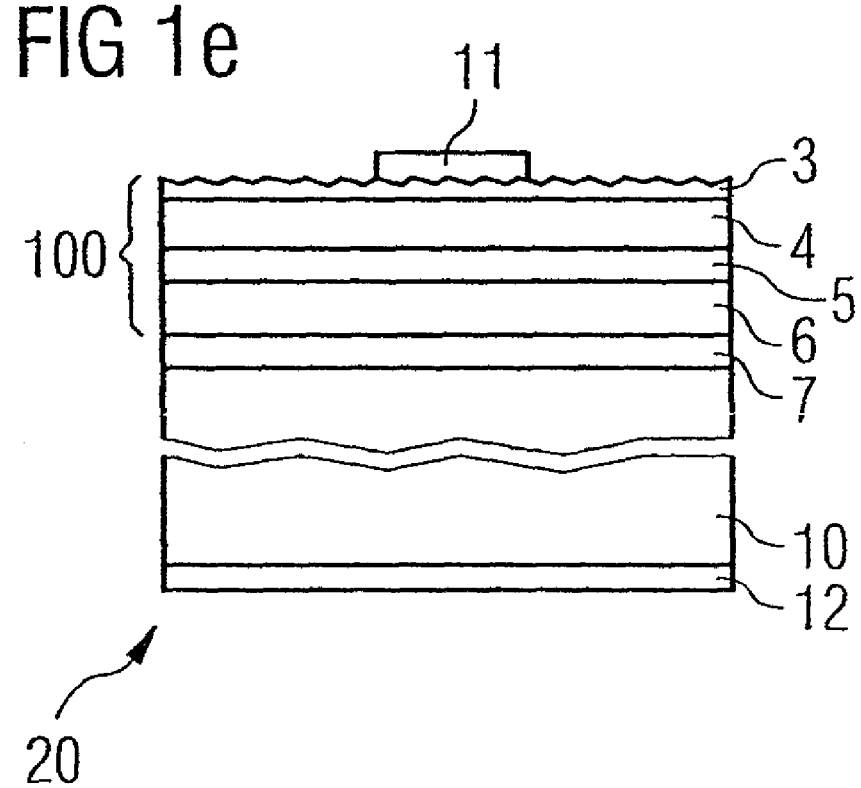

A bonding pad, in particular a bonding pad metallization for the electrical connection of the n-type side of the semiconductor layer sequence 100, is subsequently applied to the micropatterned surface of the GaN contact layer 3 (FIG. 1e). Said bonding pad has TiAl, for example.

The micropatterning of the contact layer 3 produces a roughening on a scale corresponding to the blue spectral range of the visible spectrum of electromagnetic radiation. The roughening structures are, in particular, of the order of magnitude of half an internal wavelength of the electromagnetic radiation generated in the active semiconductor layer 5.

During the growth of the epitaxial layer sequence by means of MOVPE (metal organic vapor phase epitaxy), the 000-1 crystal face (N face of the hexagonal nitride lattice) preferably faces toward the sapphire growth substrate.

A laser radiation source having a wavelength in the range of between 350 nm and 360 nm or with a shorter wavelength is used as the radiation source for the laser lift-off method.

On that side of the carrier body 10 which is remote from the semiconductor layer sequence 100, before or after said carrier body is connected to the semiconductor layer sequence 100, there is applied a contact layer 12 for the electrical connection of the thin-film light emitting diode chip 20, said chip being illustrated in FIG. 1e, such FIG. 1e showing only a part of the chip 20 (because a part of layer 10 is omitted). Said contact layer comprises Al or a Ti/Al layer sequence, by way of example.

In a further embodiment of the method, the mirror layer may be micropatterned with a similar scale to the contact layer 3 prior to the connection to the carrier body 10.

In an alternative configuration of the method according to the exemplary embodiment, after laser lift-off, only a reticulated or insular structure of metallic Ga and, if appropriate, Al residues remains rather than a completely continuous layer of metallic Ga and, if appropriate, Al on the contact layer 3, which structure, during the subsequent preliminary etching step, is at least approximately transferred into the contact layer 3 in order to deliberately offer different crystal facets for the subsequent KOH etch.

What is suitable for the preliminary etching step is once again, as described above, a dry etching method (RIE method) or a wet-chemical etching method, preferably using KOH in dilute form (e.g. KOH 5% at room temperature; etching time 5 min to 15 min).

For the subsequent etching step that follows, once again use is preferably made of KOH, particularly preferably in concentrated form as described, above.

KOH acts selectively on different crystal facets and thus leads to a microscopic roughening. In this case, etching edges from the preceding RIE process and crystal defects in the contact layer or, if appropriate, in the residual region of the buffer layer 2, if the latter has not been completely decomposed during laser lift-off, serve as etching seeds.

As an alternative, a corrosive gas, for example H or Cl, may once again be used as the etchant for the subsequent etching step, preferably at an elevated temperature that is, in particular, greater than or equal to 800° C.

The exemplary embodiment illustrated schematically in FIGS. 3a to 3e differs from that in FIGS. 1a to 1e and the various embodiments thereof in particular by the fact that virtually no or no residues at all of metallic Ga and, if appropriate, Al remain on the contact layer 3 during laser lift-off 110 (FIG. 3b), and that directly after laser lift-off 110, the contact layer 3 is etched (indicated by the arrows 130 in FIG. 3c) with a KOH-containing etchant, preferably in the concentrated form described above.

It goes without saying that in this case, too, it is possible, if expedient, to effect preliminary etching before the etching with KOH in order, for example, to uncover different crystal facets and/or defects, or it is possible, as described, to use a corrosive gas such as H or Cl as the etchant.

As an alternative, it is also possible in this case, in the same way as in the exemplary embodiment described above in conjunction with FIGS. 1a to 1e, for a residual layer of the buffer layer 2 to remain on the contact layer after separation from the substrate 1 if said buffer layer is thicker than its zone decomposed during the separation step. The roughening is then produced on the remainder of the buffer layer 2.

It goes without saying that the above explanation for the invention on the basis of the exemplary embodiments is not to be understood as a restriction of the invention to these exemplary embodiments. Rather, in particular all methods in which a separation surface of a semiconductor layer, after the material-decomposing lift-off thereof from the growth substrate, is micropatterned by means of a defect etch come under the basic concept of the invention.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. A method for micropatterning a radiation-emitting surface of a semiconductor layer sequence for a thin-film light-emitting diode chip comprising the steps of:
    (a) growing the semiconductor layer sequence on a substrate;
    (b) forming or applying a mirror layer on the semiconductor layer sequence on a surface opposite to the substrate, which reflects back into the semiconductor layer sequence at least part of a radiation that is generated in the semiconductor layer sequence during the operation thereof and is directed toward the mirror layer;
    (c) separating the semiconductor layer sequence from the substrate, wherein a separation zone made of compound semiconductor material of the semiconductor layer sequence is at least partly decomposed, and
    (d) etching a separation surface of the semiconductor layer sequence, from which the substrate has been separated and on which different crystal facets have been uncovered, by means of an etchant which predominantly etches at crystal defects and selectively etches the different crystal facets at the separation surface;
    wherein through the etching at the separation surface of the semiconductor layer sequence a roughening is produced on a scale which corresponds to a wavelength range of an electromagnetic radiation emitted by the semiconductor layer sequence during operation thereof.

2. The method as claimed in claim 1, wherein in step (d) the etchant contains KOH.

3. The method as claimed in claim 1, wherein in step (d) the etchant contains a corrosive gas.

4. The method as claimed in claim 1, wherein the semiconductor layer sequence is a radiation-emitting semiconductor layer sequence based on a nitride compound semiconductor material, and wherein in step (c) the nitride compound semiconductor material of the semiconductor layer sequence is decomposed in the separation zone such that gaseous nitrogen arises.

5. The method as claimed in claim 1, wherein the lift-off method is a laser lift-off method.

6. The method as claimed in claim 1, wherein the semiconductor layer sequence has at the separation surface an increased defect density in comparison with a part of the semiconductor layer sequence that is disposed further than the separation surface from the substrate.

7. The method as claimed in claim 1, wherein the semiconductor layer sequence contains at least one material from the system $In_xAl_yGa_{1-x-y}N$ where $0 \leq x \leq 1$, $0 \leq y \leq 1$, and $x+y \leq 1$.

8. The method as claimed in claim 1, wherein the semiconductor layer sequence has a dopant concentration of between $1*10^{18}$ cm$^{-3}$ and $1*10^{20}$ cm$^{-3}$ inclusive at its separation surface.

9. The method as claimed in claim 1, wherein the separation zone contains AlGaN, the Al content of which is chosen in such a way that it is decomposed in step (c), and Al is sintered into the semiconductor layer sequence.

10. The method as claimed in claim 1, wherein the substrate is a sapphire substrate.

11. The method as claimed in claim 1, wherein a contact pad comprising a contact metallization for electrical connection of the semiconductor layer sequence is applied to the separation surface of the semiconductor layer sequence.

12. The method as claimed in claim 1, wherein the semiconductor layer sequence is grown overall from hexagonal GaN-based material on the substrate, wherein the 000-1 crystal face (N face of the hexagonal nitride lattice) faces toward the substrate.

13. The method as claimed in claim 1, wherein a Bragg mirror is applied in step (b).

14. The method as claimed in claim 1, wherein the mirror layer has a reflective layer disposed further from the semiconductor layer sequence than a radiation-transmissive layer.

15. The method as claimed in claim 1, wherein the mirror layer has a reflection layer with a plurality of windows toward the semiconductor layer sequence and a current transport layer that is different from the reflection layer arranged in the windows.

* * * * *